United States Patent [19]
Brown et al.

[11] Patent Number: 5,621,813
[45] Date of Patent: Apr. 15, 1997

[54] PATTERN RECOGNITION ALIGNMENT SYSTEM

[75] Inventors: Robert L. Brown, Palo Alto; Hwan J. Jeong, Los Altos; David A. Markle, Saratoga; David S. Pan, Fremont; Richard B. Ward; Mark S. Wanta, both of Sunnyvale, all of Calif.

[73] Assignee: Ultratech Stepper, Inc., San Jose, Calif.

[21] Appl. No.: 558,613

[22] Filed: Nov. 14, 1995

Related U.S. Application Data

[63] Continuation of Ser. No. 431,683, May 2, 1995, abandoned, which is a continuation of Ser. No. 4,688, Jan. 14, 1993, abandoned.

[51] Int. Cl.$^6$ ..................................................... G06K 9/00
[52] U.S. Cl. ........................... 382/151; 348/95; 356/401; 387/149
[58] Field of Search .................................. 382/141, 149, 382/151, 209, 218; 358/41, 43, 51; 256/401; 364/468; 250/204; 349/94, 95, 126, 129

[56] References Cited

U.S. PATENT DOCUMENTS

| | | | |
|---|---|---|---|
| 4,233,625 | 11/1980 | Altman | 358/101 |
| 4,253,112 | 2/1981 | Doemens | 358/101 |
| 4,297,676 | 10/1981 | Moriya et al. | 340/146.3 |
| 4,425,037 | 1/1984 | Hershel et al. | 355/43 |
| 4,437,758 | 3/1984 | Suzuki | 355/41 |
| 4,515,480 | 5/1985 | Miller et al. | 356/400 |
| 4,650,983 | 3/1987 | Suwa | 250/204 |
| 4,672,676 | 6/1987 | Linger | 382/45 |
| 4,680,627 | 7/1987 | Sase et al. | 382/45 |
| 4,687,980 | 8/1987 | Phillips et al. | 318/640 |
| 4,723,221 | 2/1988 | Matsuura et al. | 364/559 |
| 4,794,648 | 12/1988 | Ayata et al. | 382/8 |
| 4,845,373 | 7/1989 | Jamieson et al. | 250/548 |
| 4,977,361 | 12/1990 | Phillips et al. | 318/640 |
| 4,980,718 | 12/1990 | Salter et al. | 355/53 |
| 5,003,342 | 3/1991 | Nishi | 355/43 |
| 5,004,348 | 4/1991 | Magome | 356/401 |
| 5,094,539 | 3/1992 | Komoriya et al. | 356/401 |
| 5,100,237 | 3/1992 | Wittekoek et al. | 356/401 |
| 5,112,133 | 5/1992 | Kurosawa et al. | 356/401 |
| 5,124,927 | 6/1992 | Hopewell et al. | 364/468 |
| 5,264,919 | 11/1993 | Tsukada | 356/401 |

OTHER PUBLICATIONS

Wilczynski, J. "Optical Lithographic Tools: Current Status and Future Potential" *Journal of Vac. Science Technology* B5 (1), pp. 288–292, Jan./Feb. 1987.

Buckley, J. and Charles Karatzas. "Step and Scan: A Systems Overview of New Lithography Tool" *SPIE vol. 1088 Optical/Laser Microlithography* II, pp. 424–433, 1989.

*Primary Examiner*—Joseph Mancuso
*Attorney, Agent, or Firm*—Allston L. Jones

[57] ABSTRACT

A substrate alignment and exposure system is disclosed The alignment is performed by capturing an image of the substrate with a pattern recognition system, determining the offset from the alignment and moving the substrate relative to the reticle to be in alignment. A first optical alignment system which captures an image of a position of the substrate off of the primary axis of the exposure optics is used to perform pre-alignment. A second optical alignment system captures an image of the reticle and the substrate through the lens of the exposure optics. The pattern recognition system recognizes the alignment keys on the reticle, alignment targets on the substrate, and computes their positions and displacement from alignment. The relative alignment can be direct or inferred. Any angular and translational misalignment is calculated. The pattern recognition system then moves the substrate to be in alignment with the reticle. In the present invention, any arbitrary feature on the reticle and substrate, including device features or specialized alignment keys and targets used by other exposure systems, can be recognized by the pattern recognition system and used for alignment.

16 Claims, 13 Drawing Sheets

| Surface | Coating |
|---|---|
| 1202 | High efficiency broadband antireflection coating covering 350 nm to 380 nm and 520 nm to 590 nm with reflectivity ≤ 0.5% |
| 1204 | Intensity balancing I line antireflection coating covering 350 nm to 380 nm |
| 1221 | Visible beamsplitter/UV antireflection coating with reflectivity ≤ 1.7% from 350 nm to 380 nm and reflectivity ≥ 15.% and ≤ 50% from 520 nm to 590 nm |
| 1222 | Visible antireflection coating covering 500 nm to 590 nm with reflectivity ≤ 0.25% |
| 1223 | High efficiency broadband antireflection coating covering 350 nm to 380 nm with reflectivity ≤ 0.5% |

Figure 13

PATTERN RECOGNITION ALIGNMENT SYSTEM

This is a continuation of application of Ser. No. 08/431,683 filed on May. 2, 1995 which is a file-wrapper continuation application of parent application Ser. No. 08/004,668, filed on Jan. 14, 1993 both now abandoned.

BACKGROUND OF THE INVENTION

1. Field of the Invention

The present invention relates to a semiconductor lithography system, and more particularly to a novel apparatus and method of aligning a substrate to a reticle.

2. Description of the Prior Art

In the semiconductor industry, several processing steps require the alignment of a substrate, such as a semiconductor wafer coated with a photosensitive material to a reticle having a pattern of a particular device layer. After alignment, the reticle is exposed to radiation to which the photosensitive coating is sensitive, to transfer the reticle pattern onto the wafer. This alignment and exposure can be performed on a variety of lithography systems such as step and repeat, projection, contact and proximity systems, for example. Typically, the first of such device layers is aligned to some marking on the wafer, for example, to a flat or notch, as is well known. Subsequent layers are then aligned relative to this first layer and/or to each other.

Most systems utilize some mechanical means of pre-aligning the wafer, so that the wafer is coarsely aligned to the reticle. The pre-alignment may be, for example, a mechanical means of locating a flat or notch on the wafer. Alternatively, optical sensors may determine the location of the flat, notch, or peripheral edge of the wafer. These methods typically align the wafer to an accuracy of a few hundred microns. After mechanical pre-alignment, the wafer is moved to or near the exposure position by, for example, a moving arm. Often, after the above-described mechanical alignment and prior to fine alignment, a pre-alignment using the photoelectric detector described below is performed. Special optical alignment targets (OATs), produced on the substrate by previous processing steps, are used for this purpose. The OATs are relatively large, so that they can be quickly found after the relatively coarse mechanical pre-alignment. This pre-alignment using the OATs typically aligns the wafer to within approximately ±50 microns or better. At this point, a fine alignment may be performed, by aligning alignment keys on the reticle to alignment targets on the wafer.

The alignment keys and targets are typically on the order of a few microns in size, and provide for alignment to a precision of, for example, 0.15 micron or less, depending upon the requirements of the user. The fine alignment can be performed via a photoelectric detector, such as a photomultiplier tube, which can detect the superposition of special purpose alignment marks on the reticle and wafer. Based upon the superposition signal level, the detection apparatus sends a signal to move the stage such that the alignment targets on the wafer are in alignment with the alignment keys on the reticle. The system may be an off-axis system, wherein the wafer is aligned out of the exposure of field of the optical system, then moved to the exposure field with high accuracy to align the wafer to the reticle. Alternatively, the alignment can be performed through the lens (TTL) of the optical system. Some off-axis systems rely upon aligning the reticle to a mechanical reference built into the lithography apparatus. The substrate is aligned to this mechanical reference as well, and thus to the reticle by commutation. However this scheme requires that the mechanical reference be frequently calibrated for the offset of the substrate to the reticle. Furthermore, very high mechanical stability is required. The TTL schemes allow the examination of the actual superposition of reticle image and the substrate for alignment, thereby eliminating the need for a mechanical reference. A TTL scheme can be configured in a variety of ways, for example, the prior art method of using the lens to view the projection of the reticle image onto the substrate. Many alignment systems require scanning, that is, relative motion between the reticle and wafer, which introduces some error.

One problem with prior art alignment systems is that the pre-alignment OATs require a relatively large area of the wafer. Often, an area equal to that of two entire die is sacrificed for this purpose, thereby reducing the possible yield of the wafer.

An additional problem in the prior art is that each type of lithography system requires that its own specially designed alignment targets be placed on the wafer in order to align the layer being exposed to a previous layer. Thus, it is often impractical to "mix and match" different lithography systems. For example, in a fabrication facility where several different types of equipment are used, a significant amount of area must be utilized to place all the necessary alignment targets on the wafer. In addition to taking up extra space in the die area, this makes it very difficult to substitute equipment as a certain lithography system cannot be used for an alignment step if the appropriate alignment target is not present. Thus, if a the particular lithography system which is used for a given step breaks down, an otherwise available lithography system cannot be used in its place. An additional problem is that if an alignment key on the reticle or alignment target on a wafer is missing or obscured, there is no way to align the wafer to the reticle.

In some applications, such as thin film head manufacture, there is no way to incorporate cooperative alignment targets between some layers because the piece part is cut up and rotated through 90 degrees between layers. In these situations, a human operator is required to align the piece part to the reticle, decreasing throughput and increasing costs.

What is needed is a system which allows for pre-alignment without the use of large OATs. What is further needed is a system which provides for precise fine alignment, without requiring that special alignment targets be placed on the wafer for that purpose. Such a system should be capable of providing for mix and match type operation such that it could be used to align a reticle to a wafer regardless of the system or systems used for the preceeding layers. Furthermore the system should be capable of aligning a wafer to a reticle, even where any predetermined alignment keys or targets have been removed or obscured. Finally, the system should provide for automatic alignment between a reticle and a substrate even when the substrate has been cut and rotated relative to the previous layer.

SUMMARY OF THE INVENTION

The present invention discloses a substrate alignment and exposure system containing primary optical means for focusing a reticle pattern onto a substrate. Additionally, provided are one or both of pre-alignment optical means which is off-axis with respect to the primary optical axis of the primary optical system and through the lens (TTL) fine alignment optical means for focusing an image of a region of the substrate on some type of imaging array. The image is then captured by a pattern recognition system. For pre-alignment, the alignment optics may be the off-axis optical means or may be the TTL fine alignment optical means. The image is searched for a previously specified pattern by the pattern recognition system. If the pattern is not present, the substrate is moved in a specified manner until the pattern is found. Once the pattern is found, any angular error between the wafer and substrate is corrected and the substrate is moved such that fine alignment targets on the substrate are positioned in the field of view of the fine alignment optics. Alternatively, only a mechanical or optical sensor pre-alignment is performed prior to positioning the wafer in the fine alignment position. After pre-alignment, the fine alignment optics provide an image showing the relative position of the alignment keys on the reticle and alignment targets on the wafer. The pattern recognition system finds the keys and targets, calculates the relative positions thereof, and causes the substrate to be moved such that the substrate and reticle are in alignment. Additionally, the image provided by the fine alignment optics can be utilized by the pattern recognition system to align the reticle relative to the alignment system and exposure system's baseline.

Additional features and advantages of the present invention will be apparent from the detailed specifications, figures, and claims herein.

BRIEF DESCRIPTION OF THE DRAWINGS

FIG. 13 shows a currently preferred embodiment of the coatings used on the beamsplitter plate of FIG. 12 for I-line exposing radiation.

DETAILED DESCRIPTION OF THE PRESENT INVENTION

An improved lithography alignment method and system is disclosed. In the following description, numerous specific details are set forth such as specific equipment types and configurations, materials, dimensions, etc. in order to provide a thorough understanding of the present invention. It will be obvious, however, to one skilled in the art that these specific details need not necessarily be employed to practice the present invention. In other instances, well known materials or methods have not been described in detail in order to avoid unnecessarily obscuring the present invention. In addition, although the present invention will be described in conjunction with aligning a semiconductor wafer to a reticle, it will be understood that the present invention can be utilized to align any type of substrate having a pattern to be transferred to any type of substrate which is to receive the pattern. Also, although the alignment is performed by moving the substrate, while the reticle remains fixed, it will be understood that the alignment could be performed by moving the reticle or by moving both the reticle and the substrate.

Figure 1:
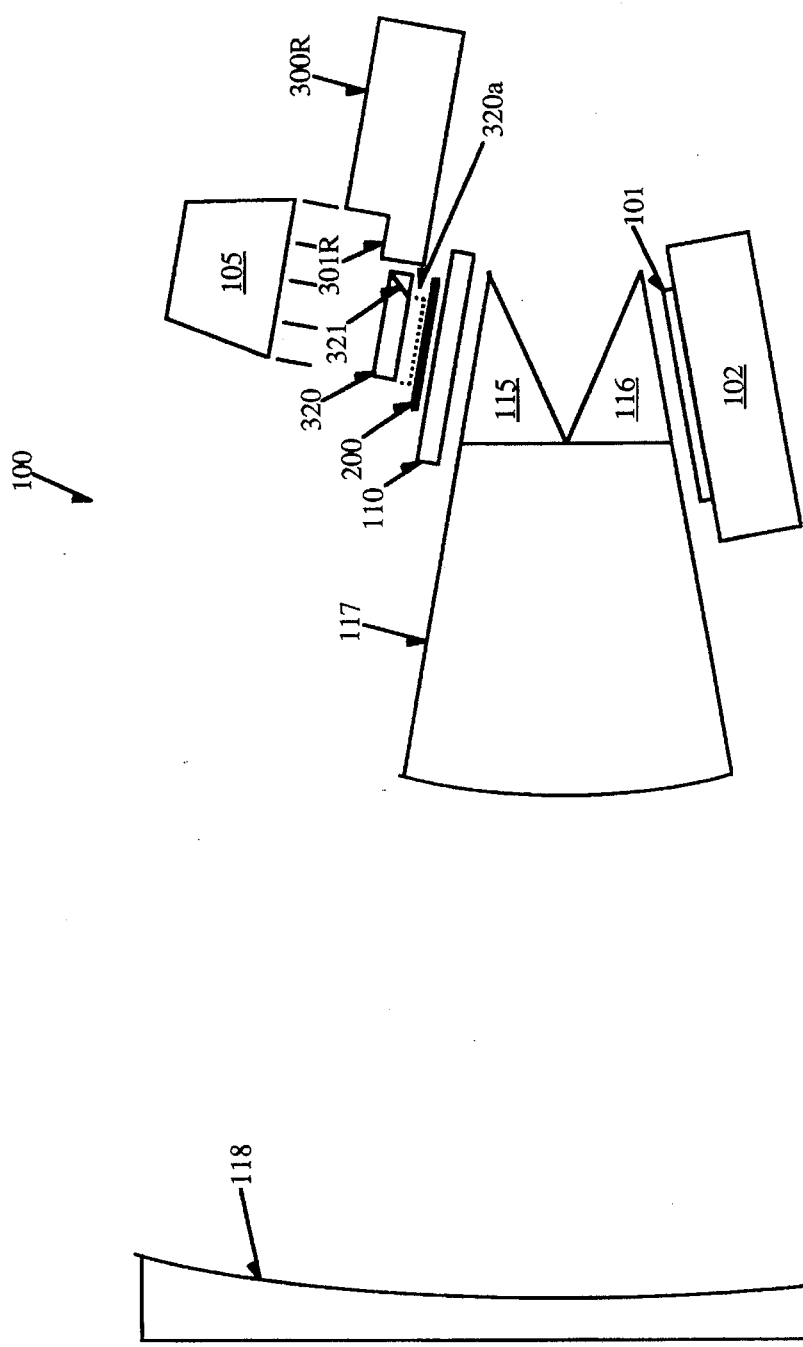
FIG. 1 shows a side view of a portion of the lithography system of the present invention.

FIG. 1 shows a side view of a currently preferred embodiment of lithography system 100 upon which the present invention is practiced. In a currently preferred embodiment, lithography system 100 is a step and repeat system, having a 1:1 correspondence between reticle feature size and wafer image size. In alternative embodiments, systems having other than a 1:1 correspondence, (known as an image reduction factor or IRF) such as, for example, a 5:1 IRF or 10:1 IRF, may be used with the present invention. Alternatively, other types of systems, such as projection alignment systems, may be used in the practice of the present invention, with modifications which will be evident to one of skill in the art. So long as the reticle and wafer can be brought into focus approximately conjugate (i.e., at optically equivalent positions), which is a necessary condition of photolithography, and the intervening lens elements will transmit a wavelength perceptible to the detector, magnification and lens design are immaterial. Additionally, the present invention can be used in any type of alignment scheme, including global, wherein a single die is aligned and the remainder of the die are exposed by blind stepping, enhanced global alignment, wherein several die are examined prior to exposure, and for example, a root mean square fit is used to determine alignment, and individual alignment of each die.

Wafer 101 on stage 102 is to be exposed to the pattern on reticle 110. Radiation, such as UV radiation from source 105 passes through compensating beamsplitter plate 320, reticle aperture 200, reticle 110 and enters upper prism 15. The radiation is reflected off the lower surface of upper prism 115 through lens 117 to primary mirror 118. From primary mirror 118 the radiation is reflected back through lens 117 to the upper surface of lower prism 116, and then to wafer 101, where the image of the pattern on reticle 110 is focused on the surface of the photosensitive layer covering wafer 101. Fine alignment optics 300 and compensating beamsplitter plate 320 shown in FIG. 1 will be discussed below.

Figure 2:
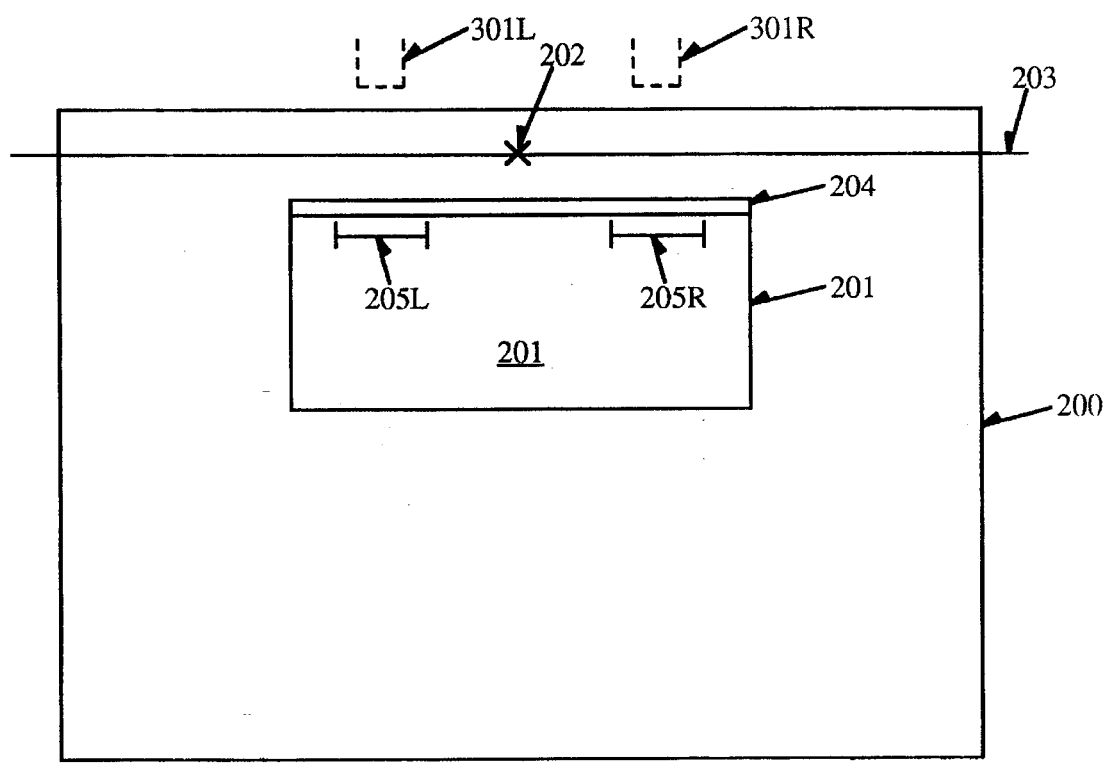
FIG. 2 shows a top down view of the reticle aperture along the optical axis of the lithography system of the present invention.

FIG. 2 shows a top down view of a portion of lithography system 100 from directly above reticle aperture 200. In FIG. 2, compensating beamsplitter plate 320 is not shown for clarity. Exposure field 201 is delineated by an opening in reticle aperture 200 which comprises a glass plate in the region indicated. The thickness of the glass plate in exposure field 201 can be varied, depending upon the thickness of the reticle 110 used, so that a constant thickness of glass is present in the optical path of lithography system 100 regardless of the thickness of the reticle 110. The "X" in FIG. 2 shows the folded position of the primary optical axis 202 of lithography system 100. System baseline 203, which passes through system optical axis 202, is a reference line used for positioning the reticle 110 in the system. In operation, data for each reticle 110 which is to be used with the system is stored in memory. The data includes a reference reticle baseline which will be used for reticle alignment. The reticle is aligned such that its baseline is coincident with system baseline 203, so that the lithography system 100 will know the relative position of the alignment keys on reticle 110. Also shown in FIG. 2 are left microscope objective 301L and right microscopic objective 301 R of fine alignment optics 300L and 300R respectively. The remainders of alignment optical systems 300L and 300R are not shown in FIG. 2 for clarity.

Figure 3:
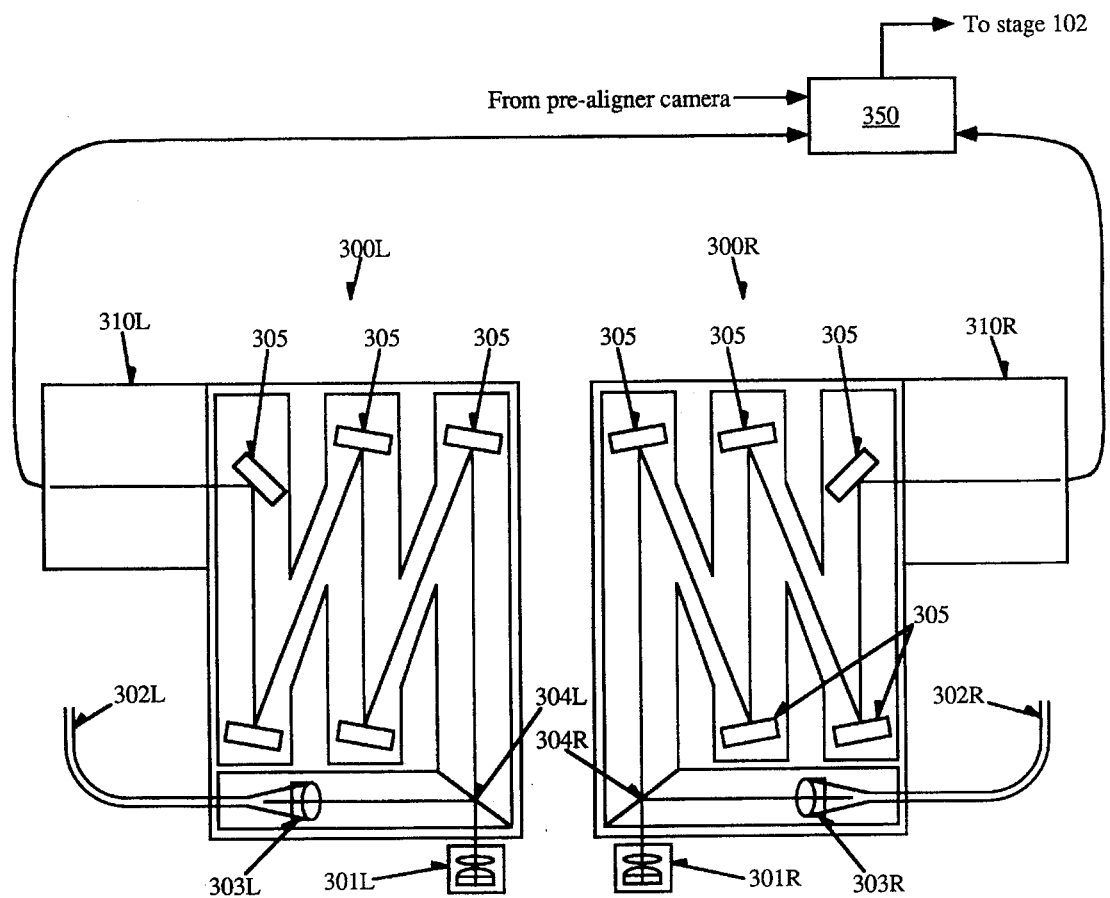
FIG. 3 shows a top, cut away view of the fine alignment optical system of the present invention.

FIG. 3 shows a currently preferred embodiment of fine alignment optics 300L and 300R. L and R are used to denote the left and right-hand side of alignment optics 300. Referring to FIG. 1, compensating beamsplitter plate 320 is shown positioned over aperture 200 directly in front of microscope objectives 301. Dichroic beamsplitter surface 321 in compensating beamsplitter plate 320 is positioned at an angle of 45° in a currently preferred embodiment. Beamsplitter surface 321 reflects visible light, but is transparent to exposing radiation in the UV range. Referring now to FIG. 3, light from fiber optic bundles 302 is directed by lens 303 to beamsplitter plate 304 and out microscope objective 301. Beamsplitter surface 321 directs this illumination generally to the regions 205 shown in FIG. 2. While the spot size of the illumination is smaller than the lengths 205 shown, the lengths 205 can be illuminated as assemblies 300L and 300R, can be moved, independently, a distance of 10 mm. in a currently preferred embodiment, to cover the ranges shown. In alternative embodiments, this range can be varied. In general, enough travel should be provided to cover approximately the full exposure field. The illumination reflecting down from beamsplitter surface 321 strikes reticle 110 directly underneath beamsplitter surface 321 in the areas 205L and 205R shown. In addition this illumination strikes semiconductor wafer 101 in a corresponding region through prism 115, lens 117, primary mirror 118 and prism 116. The illumination striking wafer 101 and reticle 110 is reflected and directed back through the optical path (for wafer 101 ) then back to beamsplitter surface 321 and through microscope objectives 301. The illumination then strikes a plurality of mirrors 305 and is directed into cameras 310. The mirrors 305 allow for sufficient length to provide for approximately 20× magnification in a currently preferred embodiment. In a currently preferred embodiment cameras 310 comprise CCD (Charge Coupled Devices). Alternatively, other known imaging arrays could be utilized in cameras 31 0. As mentioned, the image from wafer 101 and reticle 110 is magnified approximately 20×. This forms an image on the imaging array of the cameras 31 0 of sufficient size to clearly resolve the alignment keys and marks, which are typically on the order of 1–5 microns, for example. Note that compensating beamsplitter plate 320 extends a distance 320*a* beyond the portion containing beamsplitter surface 321 needed to provide an image of the region of the wafer and reticle examined for alignment. This is to ensure that the optical path of lithography system 100 is uniform (i.e., the optical path passes through the same thickness of glass) for all positions of the exposure field. Additionally, the surfaces of compensating beamsplitter plate 320 contain coatings, described below, to ensure that the optical path and exposing radiation intensity is uniform. Note that the above described arrangement allows for a static view of the wafer 101 to reticle 110 alignment. Also, with beamsplitter plate 320, the alignment can be viewed both prior to and during exposure.

Figure 12:
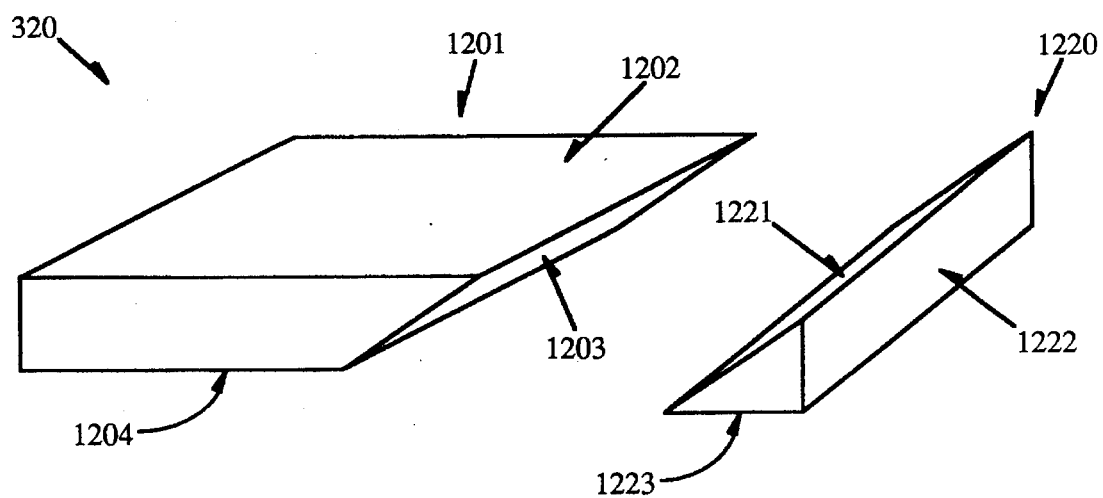
FIG. 12 shows a currently preferred embodiment of a compensating beamsplitter plate of the present invention.

FIG. 12 shows a view of compensating beamsplitter plate 320. Portion 1201 and 1220 mate to form the substantially rectangular shape shown in FIG. 1. In a currently preferred embodiment, portions 1201 and 1220 are made of optical grade fused silica. The portions 1201 and 1220 have an approximately equal index of refraction in a currently preferred embodiment. Portions 1201 and 1220 are pieced together with an optical cement which has a similar index of refraction as the portions 1201 and 1220 and will not create any other optical effects. In a currently preferred embodiment, the top surface 1202 of portion 1201 which is the surface of compensating beamsplitter plate 320 closest to radiation source 105, is coated with a high efficiency broadband anti-reflection coating, covering 390–590 nm radiation with a reflectivity of less than or equal to 0.5%. The bottom surface 1204 of portion 1201 (not shown), which is the surface closest to reticle aperture 200, is coated with an intensity balancing G-H line anti-reflection coating (390–450 nm). Referring to portion 1220, surface 1221, which mates with surface 1203 of portion 1201, is coated with a visible beamsplitter/UV anti-reflection coating with a reflectivity of less than or equal to 1.7% from 390–440 nm, and reflectivity greater than or equal to 15% and less than or equal to 50% from 520–590 nm (after cementing). Beamsplitter surface 321 of FIG. 1 comprises surface 1221 and surface 1203 when mated. Surface 1223 (not shown) is coated with a high efficiency broadband anti-reflection coating covering 390–590 nm with reflectivity less than or equal to 0.5%. The above coatings, provide for sufficient reflection of visible illumination from illumination sources 303 of FIG. 3, into objectives 301, to form an image in cameras 310. They additionally provide for uniform transmission (to within approximately ±1.0% or better) of exposing radiation in the range of 390–450 nm. It should be noted that the above coatings and other specifications are for one preferred embodiment of the present invention. With the teachings of the present invention, other combinations of coatings and materials can be utilized, to result in a uniform exposure intensity across the entire exposure field, including the portion covered by beamsplitter surface 321, as well as for sufficient reflection of detection radiation into objectives 301. The above teachings can be utilized to produce a compensating beamsplitter plate 320 for exposing radiation of wavelengths other than the above embodiment utilizing G and H line radiation (405 nm and 436 nm). For example, FIG. 13 shows the coatings used for I line exposing radiation (365 nm).

The output from cameras 310 is fed to pattern recognition system 350 in a currently preferred embodiment, as will be discussed below. In a currently preferred embodiment, pattern recognition system 350 comprises a commercially available pattern recognition system, including a command interface, such as a Cognex 1500 system, available from Cognex Corporation. Both of assemblies 300L and 300R are mounted on a bracket which allows them to slide to provide for the range 205L and 205R shown in FIG. 2. In an alternate embodiment, the light exiting optics assemblies 300L and 300R is directed by means of mirrors to a single camera to provide for a split field view. This alternate embodiment has the disadvantage, however, that as the assemblies 300L and 300R are slid back and forth across the ranges 205L and 205R, a complex optical arrangement is necessary to keep the distance between the objectives 301 and camera 310 approximately constant. In the currently preferred embodiment using two cameras, a focus distance of only 400 microns is more than adequate. The focusing of objectives 301 will be discussed in relation to FIG. 4. The use of two cameras allows for greater design simplification, as each can be moved independently, without significantly affecting focus. For example, in the present invention, alignment targets having non-symmetrical locations in the direction of the ranges 205 may readily be used.

As an alternative to compensating beamsplitter plate 320 of FIG. 1, "flip-up" prisms are used in an alternative embodiment. In this alternative embodiment, an assembly holding a prism is mounted to a bracket positioned between the fine alignment optics 300L and 300R. During alignment, the prism flips down, such that it is directly in front of objectives 301. During alignment, the prisms provide for illumination of reticle 110 and wafer 101, and provide for a view of the same, in essentially the same manner as beamsplitter surface 321. During exposure, the prism is flipped up, such that it is out of the way of radiation from source 105. Either a single prism, extending from the left most side of range 205L, to the right most side of range 205R, or alternatively, two prisms, each covering only one of the ranges 205, can be utilized. If two prisms are utilized, they can be flipped by a single mechanism attached to a bracket between the fine alignment optics 300 as with the single prism, or each can have a separate mechanism, which can be attached either to the bracket or can be mounted on top of the respective fine alignment optics 300.

Figure 4A:
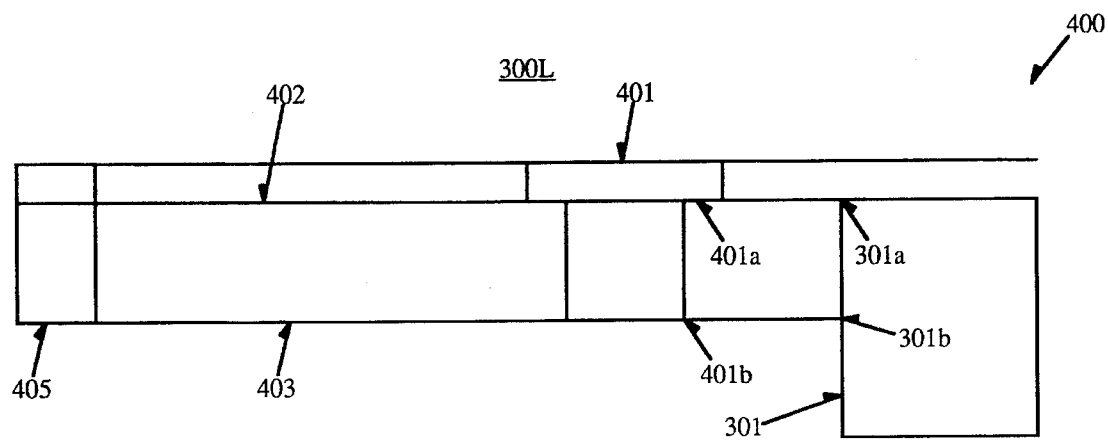
FIGS. 4A and 4B show a schematic diagram of the pneumatic focus of the present invention.
Figure 4B:
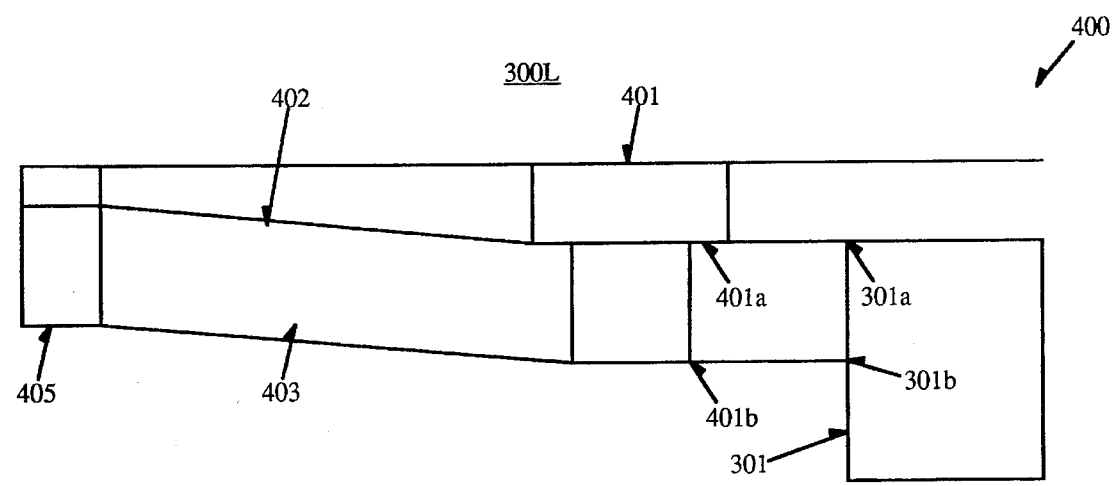

FIGS. 4A and 4B show a preferred embodiment of the focus mechanism 400 of the present invention. The focus mechanism 400 is not shown in the previous figures but is understood to be present, and in a currently preferred embodiment, is attached to the front of each of fine alignment optics 300L and 300R. FIGS. 4A and B show the same view of fine alignment optics 300 as shown in FIG. 3. Referring now to FIG. 4A, focusing mechanism 400 comprises pneumatic piston 401, rods 402, leaf spring 403 and mount 405. In a currently preferred embodiment, pneumatic piston 401 comprises a circular lower surface 401a, and a roughly concentric, and smaller, circular upper surface 401b. Two metal rods 402 (only one rod 402 is shown in FIG. 4) are attached at mount 405, lie across lower surface 401a of piston 401, and are coupled to lens 301 at or near the base of the lens at the position shown as 301a. Leaf spring 403 is attached to mount 405 as shown, lies across upper surface 401b of piston 401, and is coupled to lens 301 at a position 301b. By holding lens 301 at the positions 301a and 301b indicated, rods 402 and leaf spring 403 can securely move lens 301 without unwanted slippage or rotation. In an alternative embodiment, two rods, similar to rods 402, positioned on opposite sides of upper surface 401b are used in place of leaf spring 403.

Referring to FIG. 4B, the focusing of lens 301 is illustrated. As pneumatic piston 401 is raised, rods 402 and leaf spring 403 are raised with it. This causes lens 301 to be raised a corresponding amount. Similarly, as the pneumatic piston 401 is lowered, lens 301 is lowered with it by rods 402 and leaf spring 403. The total travel of piston 401 is, in a currently preferred embodiment, approximately 400 microns. By controlling the air pressure to piston 401, the piston 401, and therefore lens 301 may be maintained at any intermediate position. Thus, focusing mechanism 400 provides for accurate and secure movement of lens 301, to provide 400 microns of focus. Focusing mechanisms 400 provides this focus capability with lower cost, complexity, and space requirements than typical focusing mechanisms using motors and gears.

Figure 5:
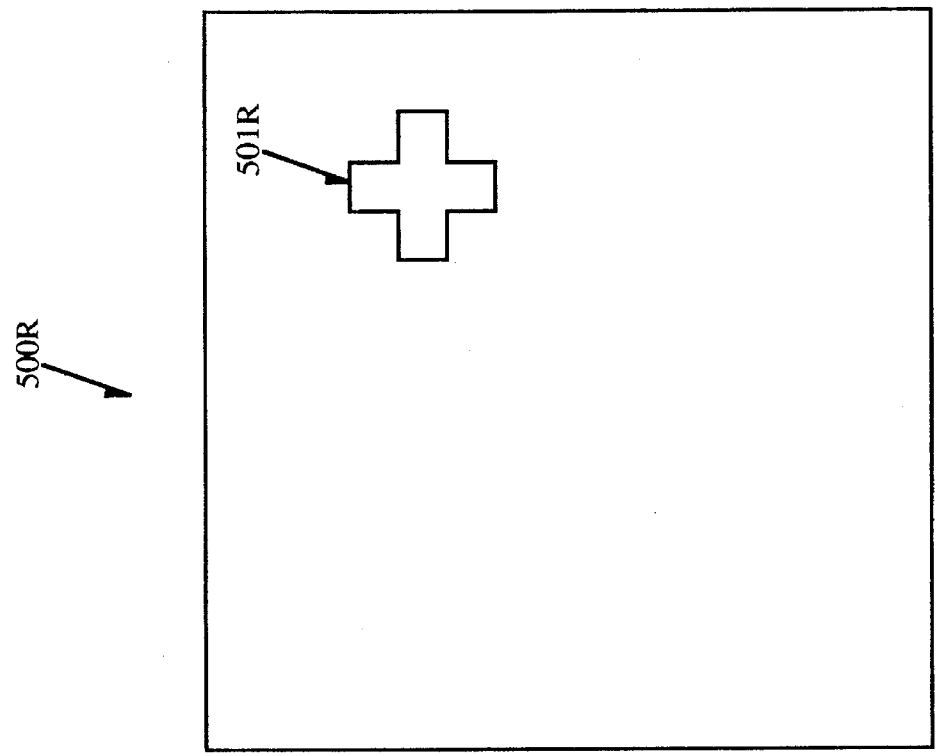
FIG. 5 shows a view through the fine alignment optics of the present invention, of the reticle alignment keys.
Figure 5:
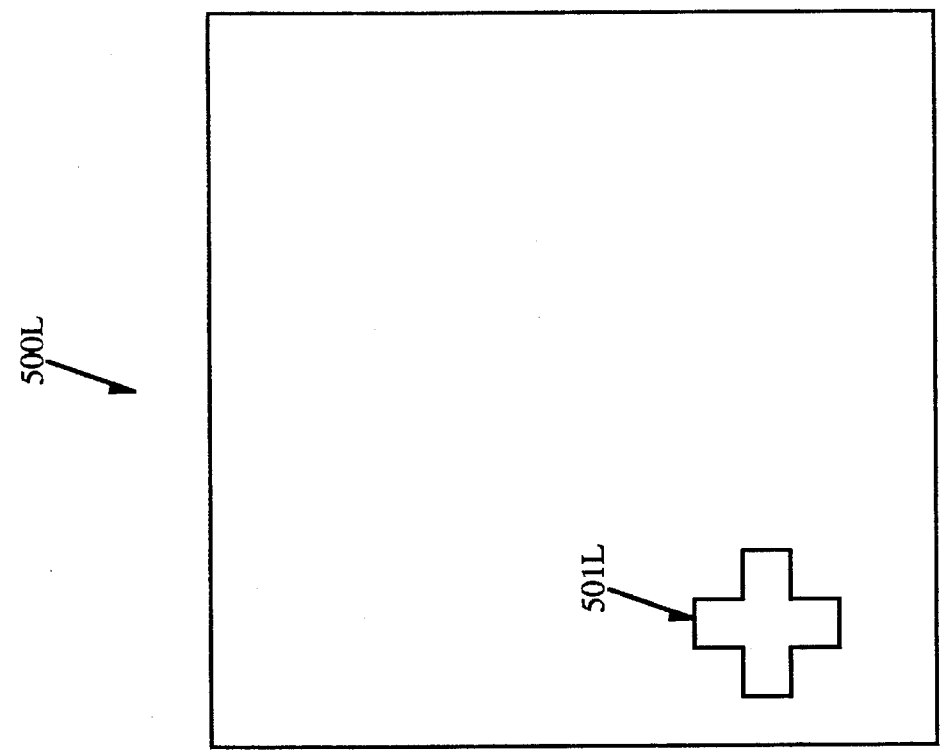

The operation of lithography system 100 will now be described with reference to the embodiments shown in FIGS. 1–4, and further in reference to the Figures which follow. First, reticle 110 is positioned in a holder (not shown in the figures). After being positioned in the holder, reticle 110 is moved to the position shown in FIG. 1 to be aligned relative to system baseline 203 as described previously. In a currently preferred embodiment, the initial reticle positioning is typically accurate within approximately ±150 microns, which places the alignment keys on the reticle within the field of view of microscope objectives 301. In a currently preferred embodiment microscope objectives 301 have a 300 micron ×300 micron field of view, and approximately 20× magnification. Next, fine alignment optics 300L and 300R are moved such that objectives 301L and 301R are placed at the appropriate position for viewing the reticle alignment keys. The correct position for each reticle will be looked up in a data base, after identifying information for the reticle has been entered into the system. After the reticle has been positioned, cameras 310L and 310R will have an image of the field of view 500L and 500R such as that shown in FIG. 5. In FIG. 5, the alignment keys are crosses 501L and 501R. In alternative embodiments, any number of known alignment keys or any convenient pattern feature may be used. Since the initial mechanical reticle positioning is typically accurate to approximately ±150 microns, the reticle keys 501 can be expected to be within the 300 micron field of view after initial placement. Provision can be made to search for keys if it is not possible to place them within the field of view, by performing, for example, a spiral search similar to that which will be described below for pre-alignment. Alignment keys 501 can be special purpose reticle alignment keys used only for reticle placement. In this case, after the reticle 110 has been aligned, it is stepped into the exposure position. Typically, the special purpose reticle alignment keys are much larger than the alignment keys for alignment to the substrate, so that they are more quickly found by the pattern recognition system. However, use of the special purpose alignment keys requires that the reticle be precisely stepped into exposure position after the reticle has been aligned. After stepping, the wafer alignment keys must then be found prior to exposure. If for some reason the wafer alignment keys are not in the fields of view of the objectives 301, another search would have to be performed after stepping. Alternatively, alignment keys 501 can be the alignment keys that will be used in wafer alignment. This approach has the advantage that after the keys have been found and the reticle aligned, no further movement of the reticle or search for keys is required. However, as these keys are typically smaller than the special purpose alignment keys, the initial search for them may be more time consuming. In the following discussion, keys 501 are assumed to be the keys used for wafer alignment. Therefore after the reticle 110 is aligned, no further movement of the reticle 110 is necessary. In a currently preferred embodiment, the reticle 110 is aligned within ±20 microns in x and y, for both the left and right sides. After alignment, the actual position of the alignment keys 501 is noted by the system.

After the reticle 110 is aligned to the system baseline 203 and objectives 301, the wafer 101 is aligned to the reticle 110. Prior to fine alignment, the wafer is coarse or pre-aligned in a currently preferred embodiment, first mechanically and then by use of pattern recognition pre-alignment. The pattern recognition pre-alignment makes use of its own optics and camera to form an image, and sends this image to pattern recognition system 350 to recognize a predetermined pattern, determine alignment, and perform a coarse alignment by instructing stage 102 as will be described below. The pre-alignment optics and camera are not shown in the figures. While a specific sequence of pre-alignment steps is described, it will be understood that not necessarily all pre-alignment steps need be utilized in the present invention. In a currently preferred embodiment, the wafer is first mechanically pre-aligned, as described in the background section, by for example, mechanically finding the flat, or by using optical sensors to find the flat or notch in the wafer. After this has been accomplished, the wafer is transported by a wafer transport arm in a currently preferred embodiment to stage 102. The mechanical alignment provides for very coarse alignment, typically within a couple hundred microns of the desired final position. After mechanical pre-alignment, an off-axis pattern recognition pre-alignment is performed in a currently preferred embodiment. This pattern recognition pre-alignment is performed prior to moving the stage 102 to the position shown in FIG. 1. With stage 102 and wafer 101 off the system optical axis 202, the wafer is viewed with a low magnification lens. In a currently preferred embodiment, 5× magnification is used for the pre-alignment. The field of view of the pre-alignment optics is in the range of approximately 1–2 mm. The pre-alignment optics are placed as close to the optical axis of the system 100 as the spacing of the various components will allow, in order to reduce any translational error that occurs when the stage 102 is moved into the optical axis of system 100.

Figure 6:
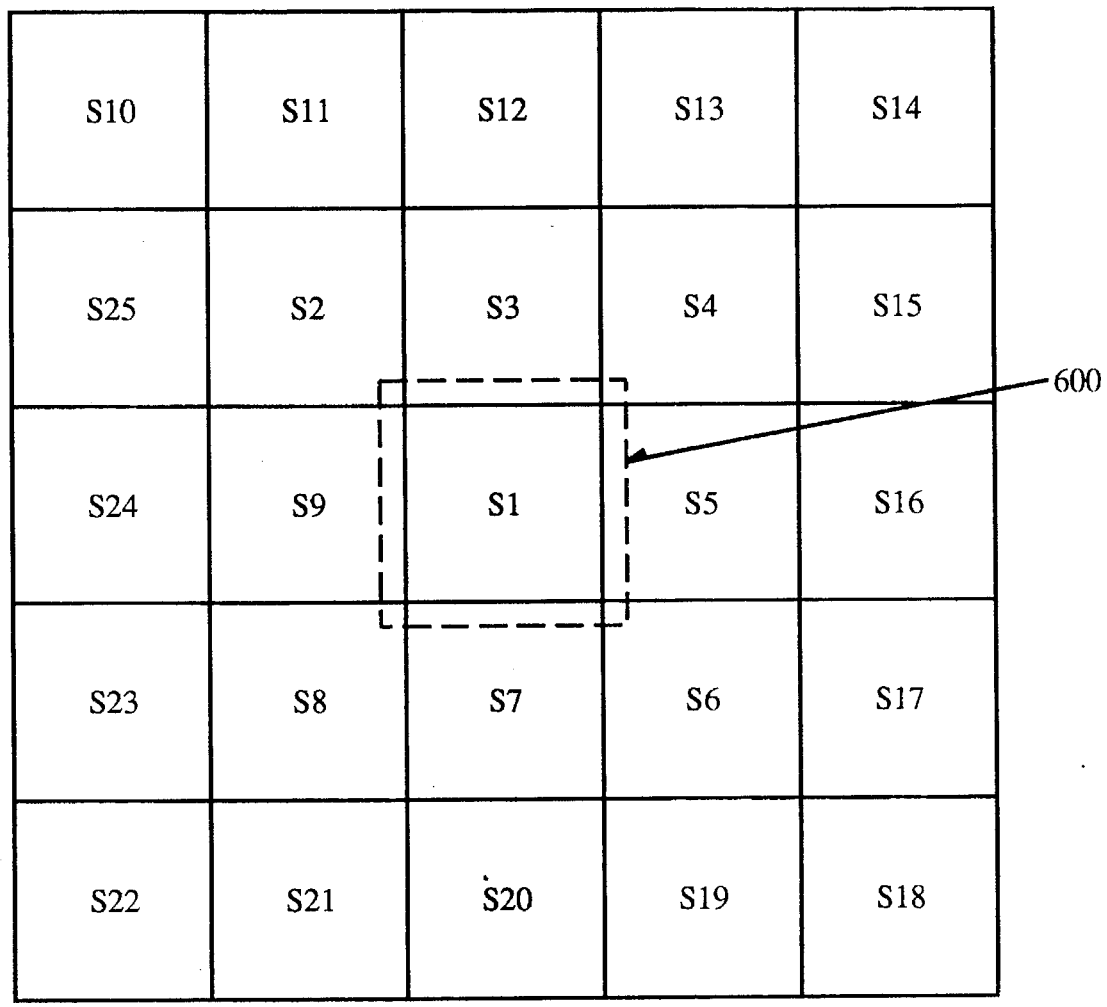
FIG. 6 shows a search pattern for finding alignment targets in the present invention.

To pre-align the wafer, the wafer is first moved to a starting position, or S1, as shown in FIG. 6. S1 is centered about the expected position of the alignment targets used for pre-alignment. The pre-alignment step can use the OATs mentioned in the background section, or can use the scribe lines or other prominent features present on the wafer. If the alignment marks are not present in the step 1 position, stage 102 then moves the wafer 101 to the step 2 position S2, then S3 and so on in a spiral search, in order to find the alignment targets. In order to ensure that the alignment targets are captured, the step size between the various steps are done in 90% increments of both the height and width of field of view 600 of the pre-alignment optics, to provide for overlap between views. The search continues until the alignment targets are found, or until a user aborts the search, or until the search has exceeded the maximum area, usually the size of a die, in which the targets are expected to appear. At each step, pattern recognition system 350 captures the image and searches for the alignment targets. With the low magnification and consequent large field of view, together with the relatively large size of the OATs, other alignment targets or wafer features used for pre-alignment, the pre-alignment targets are found relatively quickly. If the mechanical pre-alignment is sufficiently repeatable, the above-described spiral search need only be performed for the first wafer in a lot, with the stage being placed in the position where the pre-alignment targets were found on the first wafer for all subsequent wafers in the lot. Even if the mechanical pre-alignment is not sufficiently repeatable to ensure that the pattern recognition pre-alignment targets are at the same position for each wafer in a lot, the position of the pre-alignment target from the previous wafer, or a running average of positions from previous wafers, can be used as a starting point for the spiral search for subsequent wafers.

Figure 7:
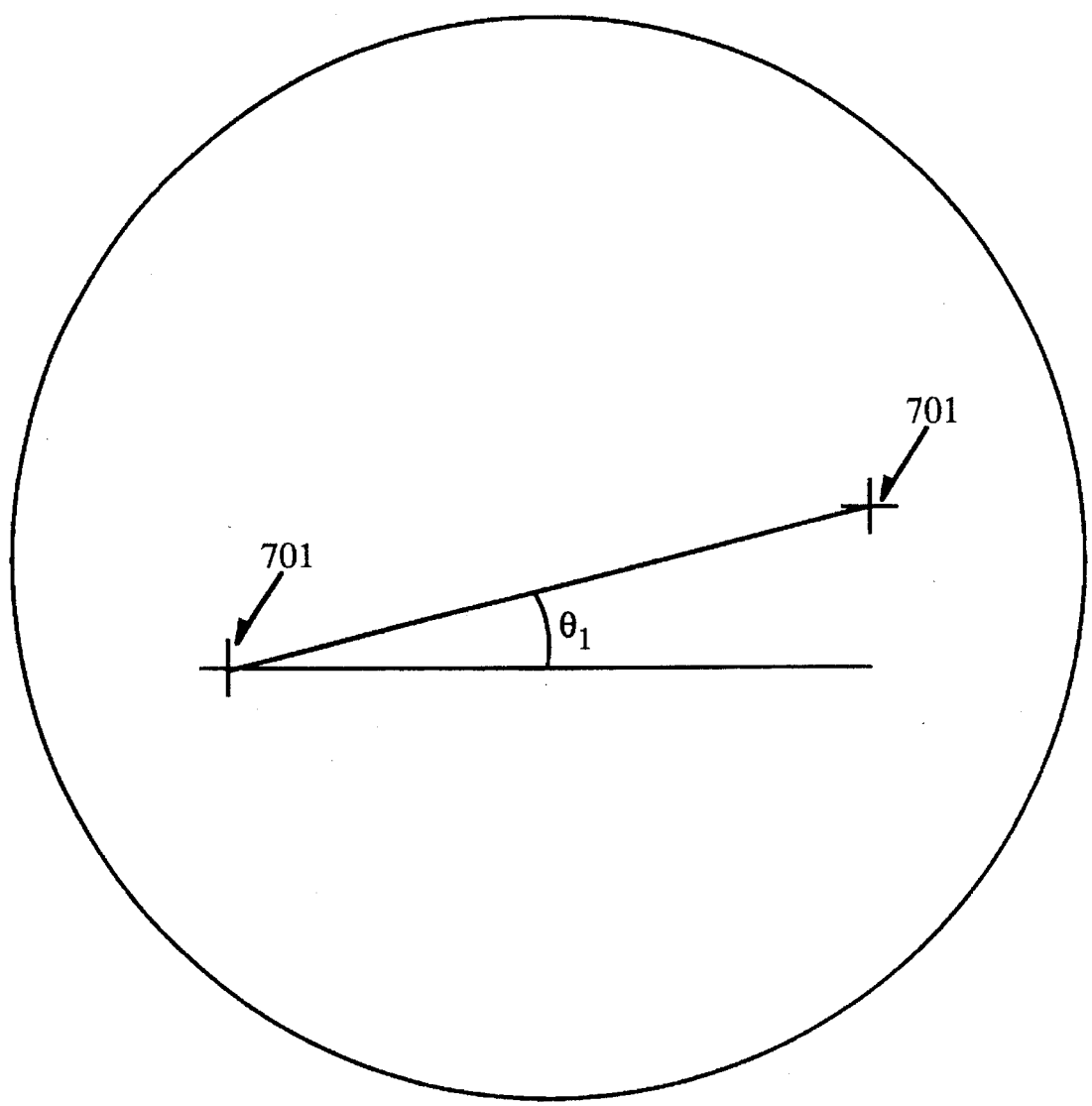
FIG. 7 shows a view provided by the optics of the pattern recognition pre-aligner of the present invention.

Once the alignment targets are found they will appear as shown, for example, in FIG. 7. In FIG. 7, two crosses are shown as the pre-alignment targets 701. Typically, the dimensions of the pattern recognition pre-alignment targets such as targets 701 are in the range of several microns through several hundred microns. After the alignment targets 701 are found, the angle $\theta_1$ is computed and compared to a maximum allowable $\theta_1$. The maximum allowable angle is that angle which will just allow the fine alignment targets (to be described below) to be within the field view of fine alignment optical system 300. That is, the maximum allowable $\theta_1$ is the angle such that one fine alignment target is at the top, while the other is at the bottom, of their respective field of views. If $\theta_1$ exceeds this maximum value, pattern recognition system 350 sends a signal to stage 102 to cause it to be rotated a sufficient amount to correct the $\theta_1$. After the $\theta_1$ correction, pattern recognition system 350 checks to see if the pre-alignment targets 701 are present in the pre-alignment optics' field of view. If not, a spiral search is performed until both alignment targets 701 are present in the field of view. This check (and search if necessary) is needed because the rotation to correct $\theta_1$ may have brought the alignment pattern out of the field of view of the pattern recognition pre-aligner.

Figure 8:
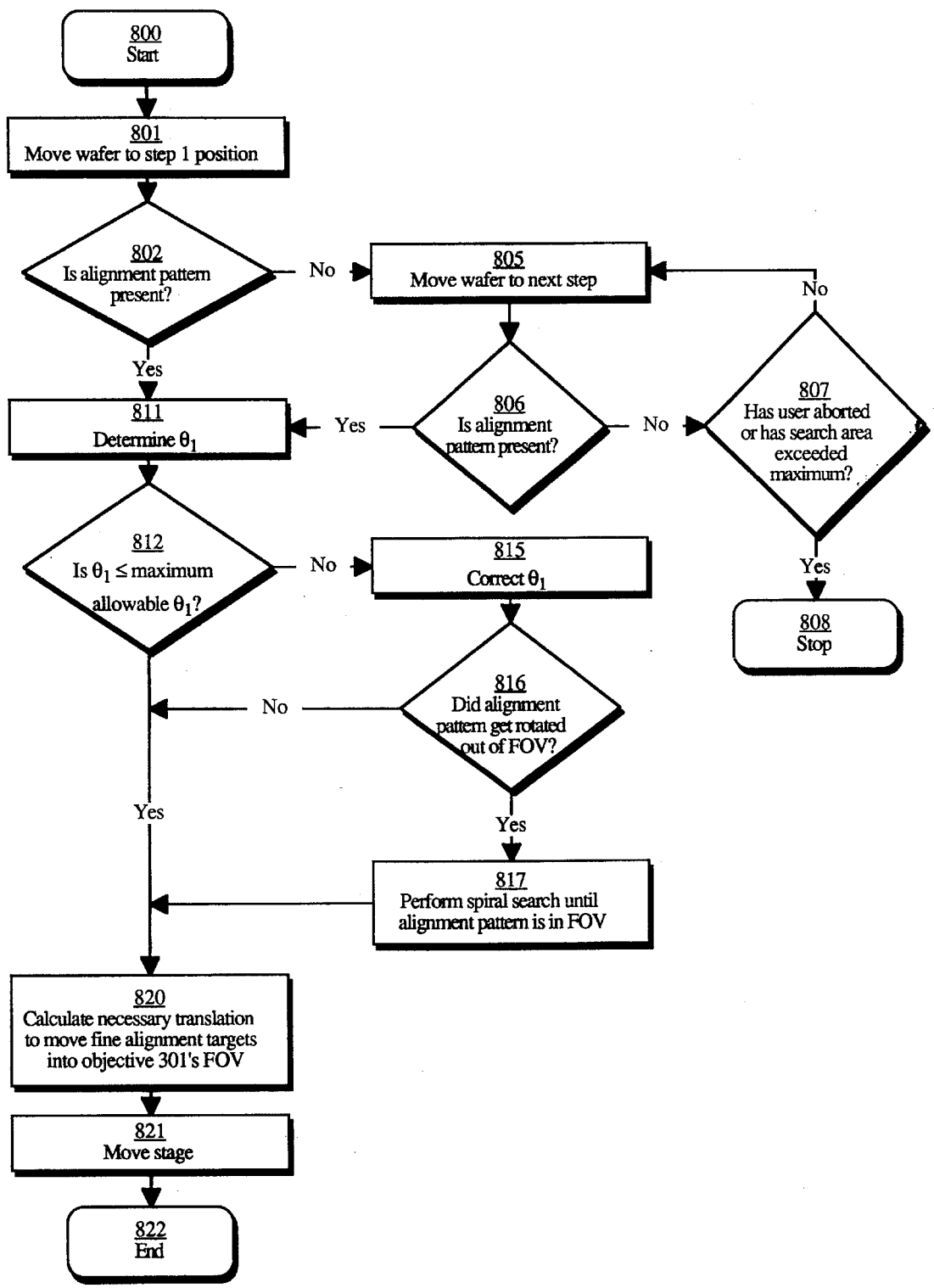
FIG. 8 is a flow chart of a currently preferred embodiment of the pattern recognition pre-alignment of the present invention.

At this point, pattern recognition system 350 knows the position of the pre-alignment targets relative to the pre-alignment optics optical axis, the position of the optical axis of the pre-alignment optics relative to optical axis 202, the relationship between pre-alignment targets 701 and the fine alignment targets on wafer 101, and the desired position of the fine alignment targets relative to optical axis 202 and baseline 203. Using this information, pattern recognition system 350 calculates the translational (x,y) movement needed in order to bring the fine alignment targets into the field of view 500 of the fine alignment optics 300. After this distance is calculated, pattern recognition system 350 sends a signal causing stage 102 to be moved such that the fine alignment targets are within the field of view 500. The x-axis of the pre-alignment optical system is maintained to be as close to parallel as possible to the optical system baseline 203 of lithography system 100 so that the pre-alignment is as accurate as possible. In a preferred embodiment, a calibration routine is used, whereby the relative alignment of the two axes is checked, and deviation from parallel is noted, and is used as an offset when moving the stage 102 from under the pre-alignment optics into the fine alignment position. Additionally, the offset between the optical axis of the pre-alignment optics and the optical axis 202 of the system is updated after fine alignment as will be described below. FIG. 8 shows a flow chart of the above described steps of the pattern recognition pre-alignment.

Figure 9:
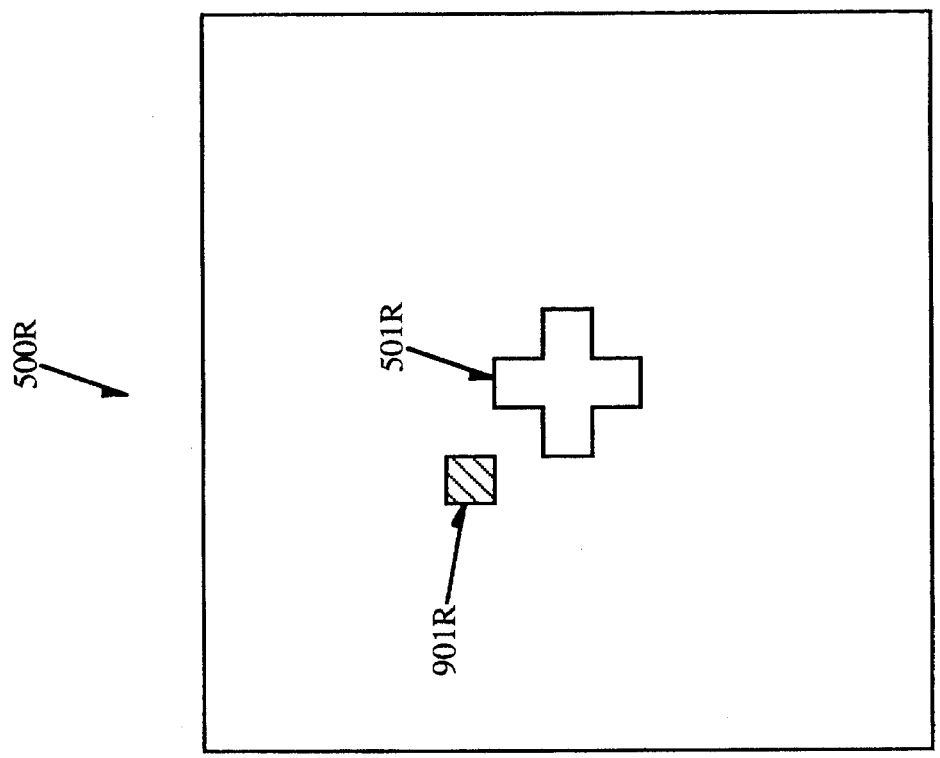
FIG. 9 shows the view of FIG. 5 additionally showing the substrate alignment targets.
Figure 9:
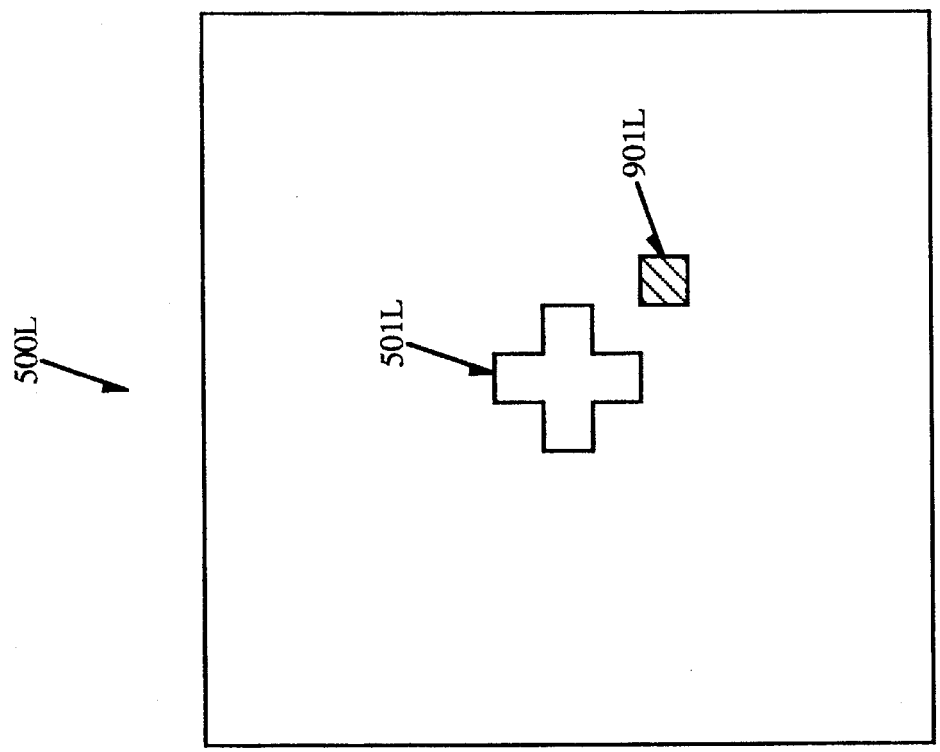

After the wafer has been pre-aligned, pattern recognition system 350 captures an image and searches for the fine alignment targets on the wafer. Again, the fine alignment targets can be any number of known alignment targets, or any convenient feature on the wafer. A view of the captured image is shown FIG. 9. In FIG. 9 alignment keys 501L and 501R of reticle 110 are present as well as alignment targets 901L and 901 R which are on the wafer. With the alignment keys 501 and targets 901 shown in FIG. 9, solid boxes 901 are to be moved in the center of crosses 501, for example. In this image, the system searches for the alignment keys 501L and 501R and notes the positions thereof. Next the system searches for the positions of wafer alignment targets 901L and 901R, and notes their position. As mentioned previously, with the pattern recognition pre-alignment discussed above, the alignment targets 901 will typically be in the field of view after the substrate is pre-aligned and the objectives have been moved to the alignment position. In an alternative embodiment, the pattern recognition pre-alignment step may be skipped, and the wafer moved directly into the fine alignment position after mechanical pre-alignment. In this alternative embodiment a spiral search such as that described earlier for optical pre-alignment is performed, in order to find the alignment targets 901L and 901R. This alternative method reduces system cost and complexity. However, since the objectives have a much narrower field of view (300 microns versus 2 mm), the search could take considerable time if the mechanical pre-alignment is not sufficiently accurate.

Figure 10:
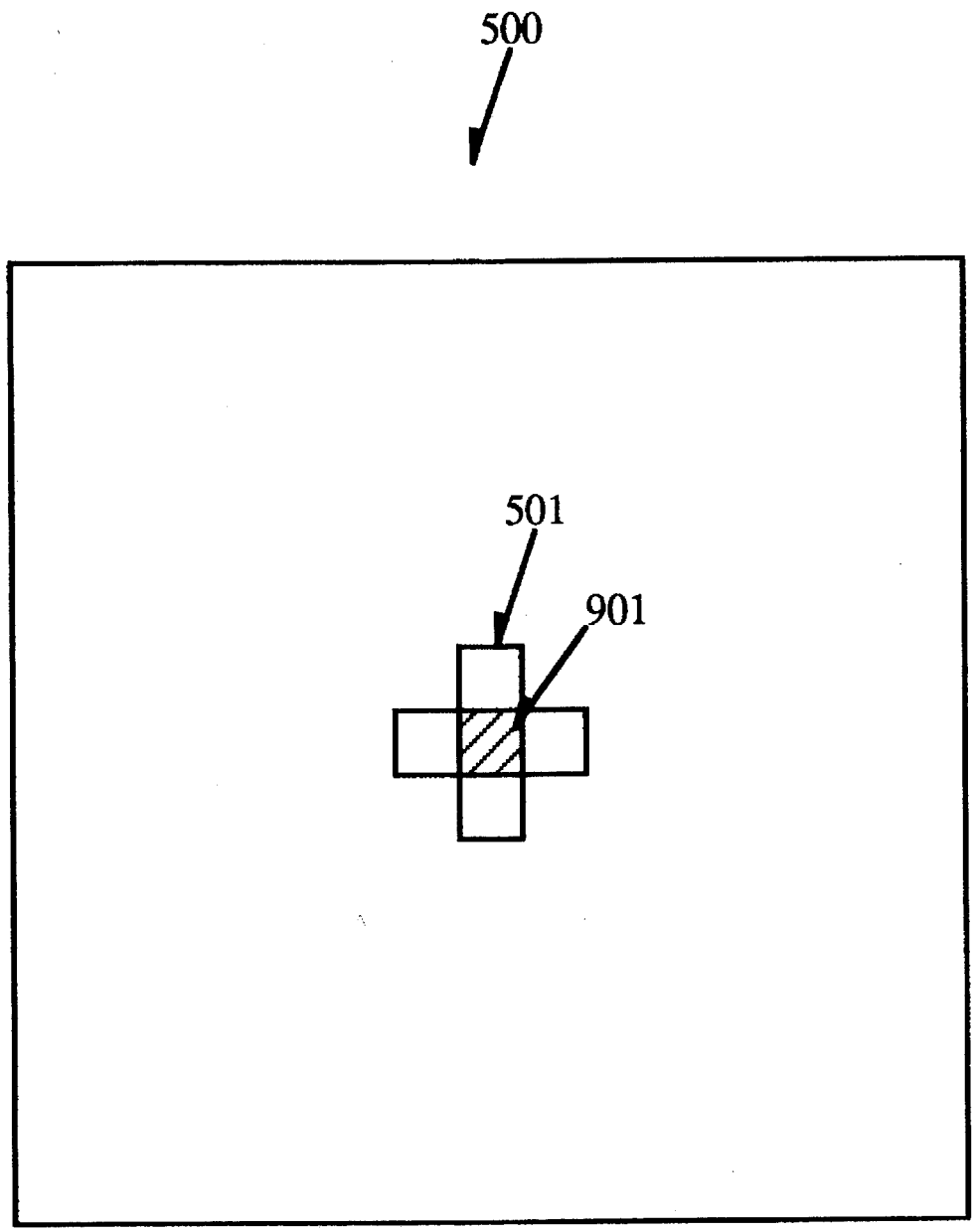
FIG. 10 shows a properly aligned reticle and substrate.
Figure 11:
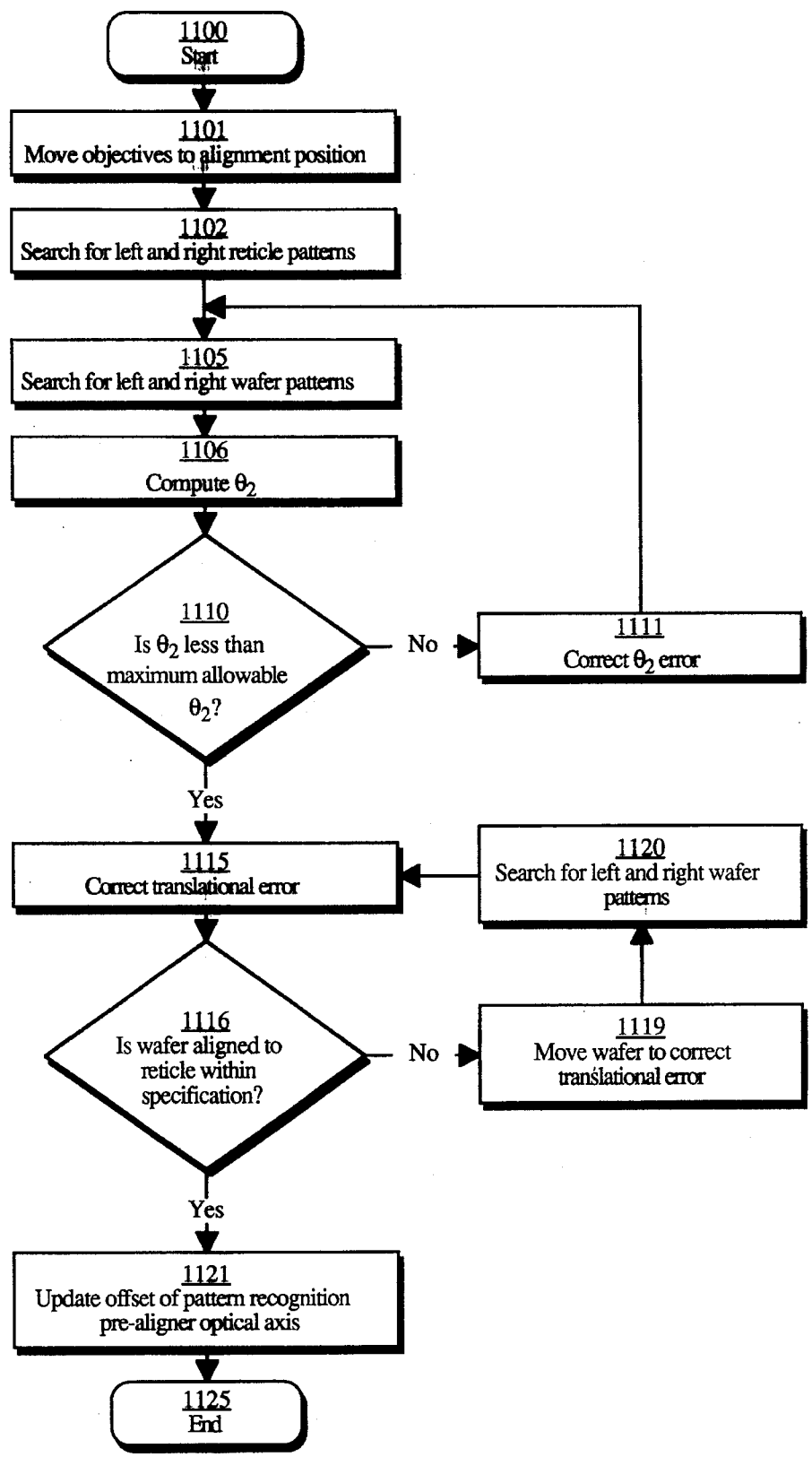
FIG. 11 shows a flow chart of a currently preferred embodiment of the process for fine aligning a substrate to a reticle in the present invention.

After the system has found the alignment targets 901L and 901R and computed their positions, the angular deviation between the wafer and the reticle base line, $\theta_2$, is calculated. If this angular displacement is more than a maximum allowable $\theta_2$, pattern recognition system 350 sends a signal to stage 102 to correct the Theta error. Again, the left and right field of views 500 are searched for the wafer patterns, $\theta_2$ is again computed and compared to the maximum allowable $\theta_2$. The maximum allowable $\theta_2$ is typically process dependent and the minimum possible value for the maximum allowable $\theta_2$ is dictated by the system's search repeatability. After the $\theta_2$ has been corrected to be less than the maximum allowable $\theta_2$, the translational error (x,y) is then calculated. After calculating this translational error, pattern recognition system 350 instructs stage 102 to move the appropriate distances in x and y, such that the alignment targets 901 are properly aligned with reference to the alignment keys 501. After each stage movement, a new image is captured, and the translated error is computed. If the error in x and or y is greater than a specified maximum, pattern recognition system 350 again instructs stage 102 to move the appropriate distance, until the alignment of targets 901 to keys 501 is within specification. An example of a properly aligned target and key is shown in FIG. 10. Typically some misalignment is permitted. In the present invention substrates can be aligned to reticles with a precision of 0.125 micron in x and y, or better. After fine alignment, the final alignment position relative to the pre-alignment targets is noted, and the actual x, y offset of the pattern recognition pre-alignment optics' optical axis relative to the lithography system 100 optical axis 202 is calculated. A running average of this offset is maintained by the system to be used for positioning the wafer 101 after pattern recognition pre-alignment as described above. The above described sequence of steps of fine aligning substrate 101 to reticle 110 is summarized in FIG. 11.

In addition to the direct alignment described above, where the alignment targets 901 were to be placed within alignment keys 501, the reticle to wafer alignment can be inferential. In such a case, when properly aligned, the targets and keys are not overlaid, but are offset a known x and/or y distance from one another. In such a case, alignment proceeds essentially as described above, with pattern recognition system aligning the targets such that they are offset from the keys the predetermined distances in x and/or y. By use of inferential alignment, the wafer can be aligned to keys on the reticle which are not subsequently printed on the wafer. Referring back to FIG. 2, as described earlier, a glass or other transparent material is placed in opening 201. A portion 204 of this glass can be coated with a visible transparent but UV blocking mask. In this way, reticle alignment keys can be positioned under portion 204 and remain visible in field of view 500. The keys are then aligned inferentially to wafer alignment targets just outside of portion 204. Upon exposure, since portion 204 masks the exposing UV radiation, the reticle alignment keys will not be present on the substrate. With either the direct or inferential alignment, the wafer 101 to reticle 110 alignment can be performed without having to view the wafer 101 and reticle 110 separately, and then precisely stepping the wafer 101 into alignment position, as is sometimes done in the prior art.

Thus, a lithography system utilizing pattern recognition for reticle alignment, wafer pre-alignment, and wafer fine alignment has been described. The system allows for automated alignment of any layer, without requiring special purpose alignment targets be placed on the wafer. The invented system will allow for greater design flexibility as OATs, fine alignment targets, and other special purpose alignment targets may not be necessary. In addition, the present invention will allow for easy substitution of one type of lithography system for another.

What is claimed is:

1. An exposure and alignment system comprising:
   an optical projection system disposed to expose a substrate with an exposure pattern from a reticle;
   an optical alignment system disposed to form a first alignment image of a first region of said reticle defining a first key pattern therein and a superimposed image of a first portion of said substrate defining a first target pattern therein through said optical projection system;
   a memory;
   a pattern recognition system to recognize said first key and target patterns in said first alignment image, wherein said first key and target patterns to be recognized are arbitrary and user selectable, wherein said first key and target patterns are learned by said pattern recognition system and stored in said memory;
   a computational subsystem coupled to said pattern recognition system to compute positions of said first key and target patterns and their positional difference to determine a deviation in position between said substrate and a reference position, in response to said position of said first key pattern.

2. The apparatus as described in claim 1, wherein said optical alignment system comprises a positional device coupled to said pattern recognition system to position said substrate approximately at a desired position relative to said first key pattern, in response to a command from said computational subsystem.

3. The apparatus as described in claim 2 wherein said substrate comprises fine alignment targets, and wherein said optical alignment system views at least a portion of said fine alignment targets, and wherein said positional device positions said substrate angularly and translationally such that said fine alignment targets on said substrate are within a first and second field of view of first and second objectives, respectively, of a fine alignment optical assembly.

4. The apparatus as described in claim 2 wherein said positioning is performed with a translational accuracy of ±50 microns or better.

5. The apparatus as described in claim 1 wherein:
   said optical alignment system further forms a second alignment image of a second region of said reticle defining a second key pattern therein and a superimposed image of a second portion of said substrate defining a second target pattern therein through said optical projection system
   said pattern recognition system further recognizes said second key and target patterns in said second alignment image, wherein said second key and target patterns to be recognized are arbitrary and user selectable wherein said second key and target patterns are learned by said pattern recognition system and stored in said memory;
   said computational subsystem further computes positions of said second key and target patterns and their positional differences to determine a deviation in position between said substrate and a reference position, in response to said position of said second key pattern; and
   said system further comprises a positional device coupled to said pattern recognition system to position said substrate relative to said reticle based upon said positions and positional differences of said first and second key and target patterns in said first and second alignment images, respectively.

6. The apparatus as described in claim 5 wherein said positioning is performed with a translational accuracy such that said exposure pattern and said first substrate are aligned to an accuracy of ±0.125 micron or better.

7. The apparatus as described in claim 5 further comprising a beamsplitter plate having a beamsplitter surface thereon, said beamsplitter surface reflecting a portion of alignment detection radiation from said first and said second regions of said reticle into said optical alignment system, said beamsplitter plate disposed over substantially all of an alignment field.

8. The apparatus as described in claim 5, further comprises a translational stage coupled to said pattern recognition system to move said substrate in a predetermined manner until said pattern recognition system finds said first and second target patterns.

9. The apparatus as described in claim 1, further comprising a translational stage couple to said pattern recognition system to move said substrate in a predetermined manner until said pattern recognition system finds said first target pattern.

10. The apparatus as described in claim 1 further comprising a beamsplitter plate having a beamsplitter surface thereon, said beamsplitter surface reflecting a portion of alignment detection radiation from said first region of said reticle into said optical alignment system, said beamsplitter plate disposed over substantially all of an alignment field.

11. A method of aligning a substrate to a reticle comprising the steps of:

learning first key and target patterns included on said reticle and substrate, respectively, and storing said first key and target patterns in a memory, wherein each of said first key and target patterns is arbitrary and user selectable;

forming a first alignment image of a first region of said substrate;

recognizing said first key and target patterns within said first alignment image computing positions of said first key and target patterns and their positional difference;

determining a deviation in position between said substrate and a reference position, in response to said position of said first key pattern.

12. The method as described in claim 6, wherein said key and target patterns are located on said reticle and substrate, respectfully, outside a useful pattern on said reticle and a region on said substrate to which said pattern is to be transferred.

13. The method as described in step 4 wherein said substrate comprises fine alignment targets, wherein said first target pattern comprises at least a portion of said fine alignment targets, and wherein said step of positioning said substrate positions said substrate angularly and translationally such that said fine alignment targets on said substrate are within a first and second field of view of first and second objectives, respectively, of a fine alignment optical assembly.

14. A method of aligning a substrate to a reticle as in claim 11 further comprising the steps of:

learning second key and target patterns included on said reticle and substrate respectively, and storing said second key and target patterns in said memory, wherein each of second key and target patterns are arbitrary and user selectable;

forming a second alignment image of a second region of said substrate;

recognizing said second key and target patterns within said second alignment image;

computing positions of said second key and target patterns and their positional difference; and determining a deviation from an aligned position of said substrate relative to said reticle, in response to said position of said first key and target patterns and said position of said second key and target patterns.

15. The method as described in claim 14 further comprising the step of positioning said substrate relative to said reticle such that said substrate and said reticle are approximately in said aligned position.

16. The method as described in claim 15 wherein said positioning is performed with the translational accuracy such that said substrate is aligned to an exposure pattern of said reticle to an accuracy of ±0.125 micron or better.

* * * * *